US008147137B2

(12) United States Patent
Patalay et al.

(10) Patent No.: US 8,147,137 B2
(45) Date of Patent: Apr. 3, 2012

(54) PYROMETRY FOR SUBSTRATE PROCESSING

(75) Inventors: Kailash Kiran Patalay, Santa Clara, CA (US); Aaron Muir Hunter, Santa Cruz, CA (US); Bruce E. Adams, Portland, OR (US)

(73) Assignee: Applied Materials, Inc., Santa Clara, CA (US)

( * ) Notice: Subject to any disclaimer, the term of this patent is extended or adjusted under 35 U.S.C. 154(b) by 740 days.

(21) Appl. No.: 12/273,809

(22) Filed: Nov. 19, 2008

(65) Prior Publication Data

US 2010/0124248 A1    May 20, 2010

(51) Int. Cl.
*H01L 21/00* (2006.01)
*H01L 21/02* (2006.01)
*H01L 21/324* (2006.01)
*H01J 5/00* (2006.01)

(52) U.S. Cl. ......... 374/121; 219/411; 392/416; 118/725

(58) Field of Classification Search ................... 118/725; 219/405, 411; 392/416; 374/120, 131, 132, 374/161, 178
See application file for complete search history.

(56) References Cited

U.S. PATENT DOCUMENTS

| | | | |
|---|---|---|---|
| 5,791,782 A | 8/1998 | Wooten et al. | |
| 5,985,678 A | 11/1999 | Kiyama | |
| 6,179,466 B1 * | 1/2001 | Peuse et al. | 374/128 |
| 6,301,434 B1 * | 10/2001 | McDiarmid et al. | 392/416 |
| 6,398,406 B1 * | 6/2002 | Breiland et al. | 374/128 |
| 6,440,866 B1 * | 8/2002 | Collins et al. | 438/714 |
| 7,115,837 B2 * | 10/2006 | Timans et al. | 219/405 |
| 7,398,693 B2 * | 7/2008 | Ranish et al. | 73/727 |
| 7,414,224 B2 * | 8/2008 | Aderhold et al. | 219/390 |
| 7,718,926 B2 * | 5/2010 | Matsuzawa et al. | 219/411 |
| 2001/0021216 A1 | 9/2001 | Storbeck | |
| 2005/0223994 A1 | 10/2005 | Blomiley et al. | |
| 2011/0155058 A1 * | 6/2011 | Carlson et al. | 118/722 |

FOREIGN PATENT DOCUMENTS

JP     05196505 A  *  8/1993

OTHER PUBLICATIONS

International Search Report and written Opinion for PCT patent application PCT/US2009/059857 (Apr. 30, 2009).

* cited by examiner

*Primary Examiner* — R. A. Smith
(74) *Attorney, Agent, or Firm* — Kilpatrick Townsend & Stockton LLP

(57) ABSTRACT

A substrate processing system includes a processing chamber, a pedestal for supporting a substrate disposed within the processing chamber, and an optical pyrometry assembly coupled to the processing chamber to measure an emitted light originating substantially from a portion of the pedestal or substrate. The optical pyrometry assembly further includes a light receiver, and an optical detector. The optical pyrometry assembly receives a portion of the emitted light, and a temperature of the substrate is determined from an intensity of the portion of the emitted light near at least one wavelength.

25 Claims, 10 Drawing Sheets

PYROMETRY FOR SUBSTRATE PROCESSING

BACKGROUND

The application relates generally to semiconductor processing equipment and particularly to measuring the temperature of pedestals and susceptors with optical techniques at relatively low temperatures.

Semiconductor processing equipment is used in the deposition, patterning, and treatment of thin films and coatings. A conventional substrate processing chamber provides a pedestal or some equivalent way of supporting the substrate for processing. Heat may be provided to the substrate by heating the pedestal with a resistive mechanism or by using heat lamps to heat the pedestal and substrate. Lamps are typically located outside the processing chamber. The light is allowed in through viewports or domes made of highly optically transmissive material such as quartz. Quartz is also attractive due to the low coefficient of thermal expansion and high melting temperature.

High temperature processes often use quartz domes and external lamps to quickly raise the temperature of the substrate to a processing temperature. Illustrative examples of processes and associated process chambers which employ such architectures are epitaxial film growth (often referred to as EPI) and rapid thermal processing (RTP). A pedestal is often referred to as a susceptor in processes which use lamps for heating. Processed film characteristics (e.g. film thickness, density, dopant density etc.) in these processes, as well as other processes, can be sensitive to substrate temperature.

Traditional methods of determining temperature involve thermocouples mounted in various locations inside the processing chamber. Difficulties with thermocouples involve drifts in the temperature measurement due, in part, to degradation of the thermocouple joint or a change in position. The substrate temperature may be monitored by aiming a pyrometer through a top quartz dome at the substrate generally from above. Another method of measuring the substrate temperature consists of aiming a pyrometer at the underside of the susceptor through a bottom quartz dome forming the underside of the processing chamber. The temperature of the substrate can be correlated to the temperature of the susceptor in a lookup table or using a correlation factor or other calculation.

Traditional high temperature processes involve substrate temperatures in the range 650° C. to 1150° C. Some processes are being used or are under development involving substrate temperatures in the range 300° C. to 650° C. One such deposition process involves the formation of a silicon carbide layer on a silicon substrate. Using a pyrometer at these lower temperatures is difficult due to the much smaller amount of light emanating from the substrate or susceptor. Background light coming from other areas of the chamber or even reflected light originating from the heat lamps can result in a poor substrate temperature reading.

Therefore, what is needed is a system and method for reliably and quickly measuring substrate temperature even at low temperatures.

BRIEF SUMMARY

Disclosed embodiments pertain to a system and method for accurately and reproducibly measuring substrate and pedestal (e.g. susceptor) temperatures with optical pyrometry. Low measurements are made possible with these systems in methods.

A substrate processing system includes a processing chamber, a substrate located within the processing chamber (possibly on a pedestal or susceptor), and an optical pyrometry assembly coupled to the processing chamber to measure an emitted light originating substantially from a portion of the substrate (such as the top or the edge) or pedestal (such as the bottom or the edge). The optical pyrometry assembly further includes a light receiver, and an optical detector. The light receiver may be within the processing chamber. The optical pyrometry assembly receives a portion of the emitted light, and a temperature of the susceptor, pedestal or substrate is determined from an intensity of the portion of the emitted light near at least one wavelength. A method of measuring a temperature of a substrate during processing, includes disposing a light pipe near a substrate or a pedestal supporting the substrate, shielding the end of the light pipe from stray light so that the end of the light pipe receives light predominantly from the edge of the pedestal, purging the end of the light pipe with a gas to reduce contamination of the end of the light pipe, detecting a portion of the light emitted from the substrate or pedestal and received by the light pipe, and determining a temperature of the substrate from the intensity of the portion of the emitted light from the substrate or pedestal near at least one wavelength. Stray light, as used herein, means light which originates from a source other than the substrate or pedestal. Note that light may come from, for example, the pedestal but not originate from the pedestal. This may occur if light originating from heat lamps reflects off the pedestal.

Further areas of applicability of the present disclosure will become apparent from the detailed description provided hereinafter. It should be understood that the detailed description and specific examples, while indicating various embodiments, are intended for purposes of illustration only and are not intended to necessarily limit the scope of the disclosure.

BRIEF DESCRIPTION OF THE DRAWINGS

A further understanding of the nature and advantages of the invention may be realized by reference to the remaining portions of the specification and the drawings, presented below. The Figures are incorporated into the detailed description portion of the invention.

Figure 1:
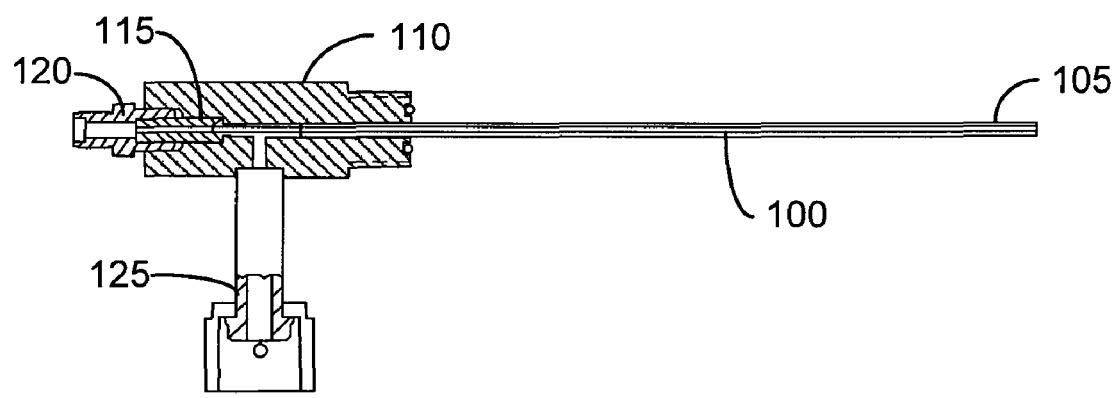
FIG. 1 is a cross-sectional view of an optical pyrometry assembly according to disclosed embodiments.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Aspects of embodiments disclosed herein are used to improve the performance of substrate processing systems by improving the accuracy and repeatability of the determination of the temperature of a substrate in a substrate processing system. Substrate temperatures are determined herein through the use of optical pyrometry. Disclosed embodiments improve the temperature reading of the substrate by reducing the stray light hitting the optical detector and managing the emissivity of the material from which the light originates.

Properties of disclosed embodiments are often described herein with particular relevance to high temperature substrate processing systems which have traditionally made heavy use of pyrometry due to the large amount of emitted light coming from substrates and pedestals at high temperatures. However, other processing equipment in use now and those not yet developed may also benefit from aspects of the disclosed embodiments. Those aspects enable the use of pyrometry at lower temperatures than in traditional systems.

An exemplary process and associated process chamber is used as a vehicle to disclose embodiments herein. The exemplary process is epitaxial film growth (a.k.a. EPI) and EPI processing chambers typically use pyrometers located entirely outside the processing chamber. The pyrometers are often located above the substrate and sometimes below the substrate (looking up towards the susceptor). Both locations rely on the pyrometer receiving light from the substrate and/or the susceptor after the light has passed through quartz often in the form of a quartz dome.

Accurate pyrometry measurements generally require knowledge of the emissivity of an object (substrate, susceptor, etc.) at unknown temperature. Unfortunately, emissivity is generally dependent on temperature, surface conditions, dopant density and many other variables. Outside of virtual black bodies and gray bodies, emissivity also varies with wavelength. The variation of emissivity as a function of temperature is the most troublesome since the temperature is unknown. Pyrometry is preferably done on objects with little variation of emissivity on temperature. Higher emissivity surfaces may also enable more accurate pyrometry measurements.

Depending on surface conditions and dopant types and levels, silicon substrates may have low emissivity at low substrate temperatures and a strong dependence of emissivity on wavelength. The emissivity of silicon is uniformly high at 942 nm for temperatures above about of 250° C., however the emissivity may vary by an order of magnitude at 1.55 µm and 3.3 µm from 250° C. to 600° C. which make accurate readings difficult at the two longer wavelengths. An alternative to making pyrometry measurements from the substrate is to perform pyrometry on the susceptor (or a pedestal in general).

In EPI and other processes, making pyrometry measurements from silicon at wavelengths below 1 µm may avoid a problem due to emissivity variation with substrate temperature in exchange for a problem involving increased sensitivity to background light signals originating from the heat lamps. The lamps produce much more illumination than the substrates due to their significantly higher temperatures. A substrate at 900° C. may be heated by a lamp at 2100° C. and a substrate at 400° C. corresponds to a heat lamp at 1800° C. For 942 nm radiation, the intensity emitted by a lamp at 2100° C. is about two orders of magnitude higher than the intensity emitted by a substrate at 900° C. However, the intensity emitted by a lamp at 1800° C. is about six orders of magnitude higher than the intensity emitted by a substrate at 400° C. At longer wavelengths, this effect is reduced. For 3.3 µm radiation, the intensity emitted by a lamp at 2100° C. is about one order of magnitude higher than the intensity emitted by a black body at 900° C. while the intensity emitted by a lamp at 1800° C. is about two orders of magnitude higher than the intensity emitted by a black body at 900° C.

Especially for shorter wavelengths, background radiation from the lamps can significantly affect a pyrometry measurement. Disclosed embodiments enable optical pyrometry to be used for high intensity ratios of lamp radiation to substrate radiation. These disclosed embodiments are especially helpful for low substrate temperatures and shorter wavelengths.

FIG. 1 is a cross-sectional view of an optical pyrometry assembly according to disclosed embodiments. Shown in FIG. 1 is a light pipe 100 supported within a sheath 105 extending from a sheath support body 110. A ferrule 115 may make a physical seal against the light pipe 100. The light pipe 100 can extend outside the processing chamber (to the left in the figure). Alternatively, the light pipe 100 may terminate near the ferrule 115 as shown and light can be detected after exiting the light pipe 100. A coupler 120 is also shown which may be used to facilitate connecting the pyrometer sensor. The sheath 105 may be made from a material which tolerates the process temperatures. The sheath may be made from refractory and/or optically absorbing materials such as silicon carbide, silicon carbide coated graphite, silicon nitride and aluminum nitride. The light pipe may be a sapphire rod, a sapphire rod coated with reflecting material or a fiber optic cable with core and integrated cladding in disclosed embodiments.

In order to protect the end of the light pipe 100 extending into the processing region (to the right in the figure) from process conditions, a purge gas may be flowed through a purge connection 125. A purge gas may contain a gas or gases which have little or no effect on the process in the processing chamber. In embodiments, the gas may contain hydrogen, nitrogen, and/or argon. The flow rate of the purge gas is high enough to suppress deposition or etching of the receiving end of the light pipe but low enough to avoid requiring excessive pumping speeds and may be between about 200 standard cubic centimeters per minute (sccm) and 8 standard liters per minute (slm). The sheath may be optically absorbing ceramic materials such as silicon carbide, silicon nitride or other ceramics such as alumina in different disclosed embodiments. A second sheath made from a less brittle material (such as stainless steel) may surround the optically absorbing sheath to provide support and protection against damage or breakage. The second sheath may extend partially down the length of the sheath to maintain a distance between the second sheath and the processing region of the processing chamber. Maintaining this distance is helpful in the case of a metal second sheath, since some processes are detrimentally affected by metallic contamination.

Figure 2:
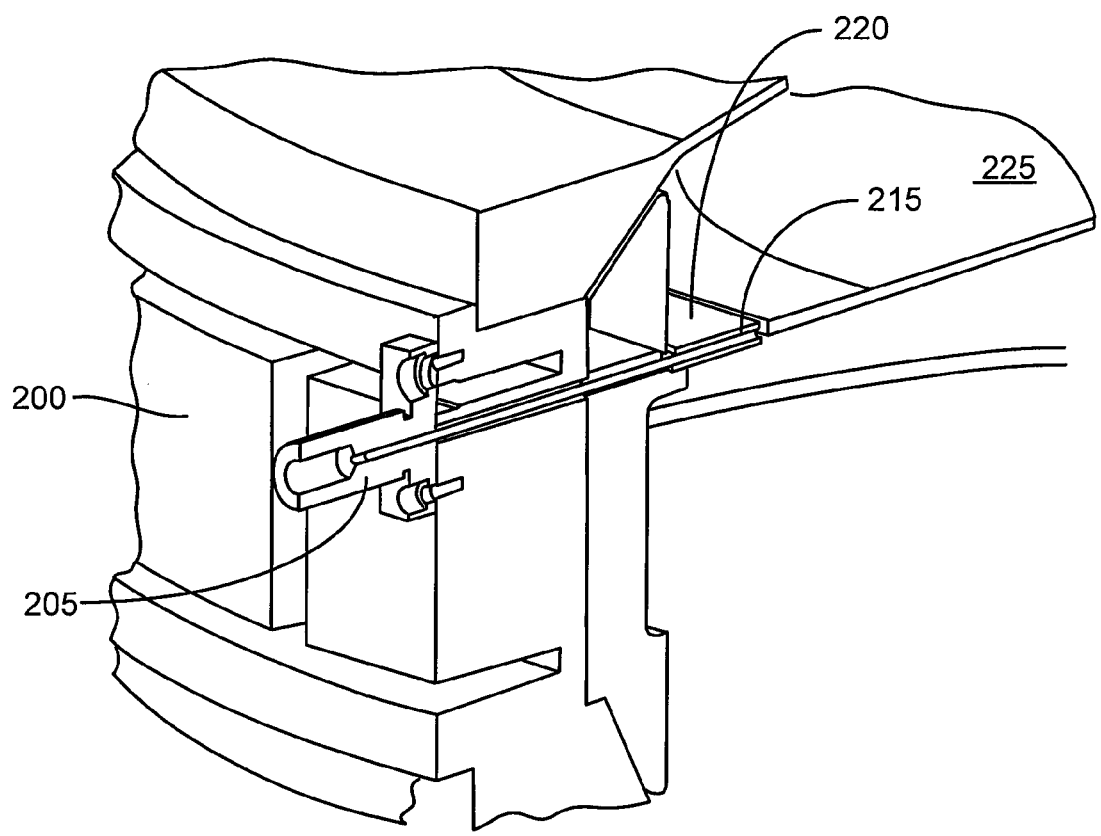
FIG. 2 is a perspective view of an optical pyrometry assembly mounted on a substrate processing system according to disclosed embodiments.

FIG. 2 is a perspective view of an optical pyrometry assembly mounted on a substrate processing system 200. Substrate processing system 200 is shown along with a sheath support body 205. The sheath support body 205 supports an optically absorbing sheath 215 which extends through a hole or slot made in preheat ring 220. A light pipe is not shown in FIG. 2 but would be located inside the optically absorbing sheath 215. For example, in one embodiment light pipe 100 can be disposed inside the optically absorbing sheath 215. The optical pyrometry assembly is shown aiming at the edge of a susceptor 225 in this view but can also be aimed at the substrate (not shown). The assembly may also be aimed at top of the substrate, the bottom of the pedestal or any other accessible portion of the substrate or pedestal.

Figure 3A:
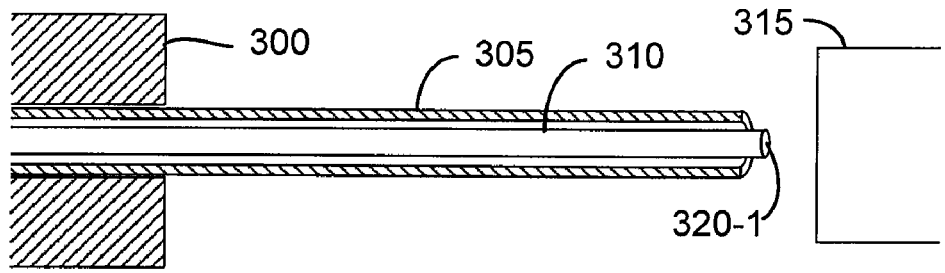
FIGS. 3A-E are cross-sectional views of pyrometer assemblies according to disclosed embodiments.
Figure 3B:
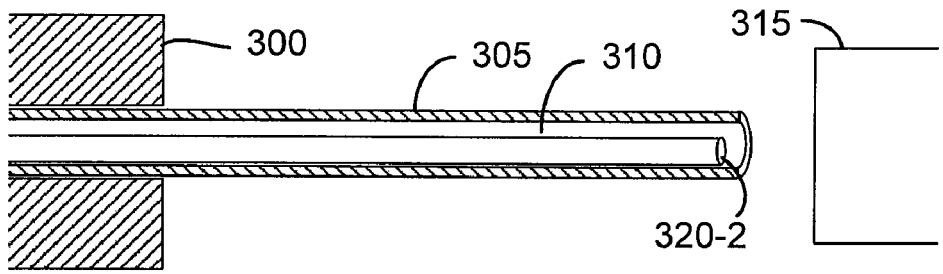

FIGS. 3A-E are cross-sectional views of pyrometer assemblies shown in more detail. FIG. 3A shows a light pipe 310 inside a sheath 305. In embodiments, the sheath 305 may only be partially absorbing near the optically wavelength(s) used for a pyrometry measurement. The sheath 305 is supported by a sheath support body 300. A light receiver 320-1, in this embodiment, is the end of the light pipe which extends toward the substrate 315. By positioning the light receiver 320-1 near the substrate 315, the amount of light the light pipe 310 receives from sources other than the substrate 315 (for example heat lamps) is reduced. A further reduction is achieved in the remainder of the disclosed embodiments shown in FIGS. 3B-E. FIG. 3B shows the light pipe 310 retracted relative to the sheath 305 such that a light receiver 320-2 is positioned inside the sheath 305. The sheath 305 may be made optically absorbing so that light from sources other than the substrate 315 are less likely to enter the light pipe 310. The spacing between the end of the sheath 305 and the substrate 315 and the spacing between the light receiver 320 and the substrate 315 may be varied to adjust the collection efficiency of light from the substrate 315 and to promote the rejection of light from other sources.

Figure 3C:
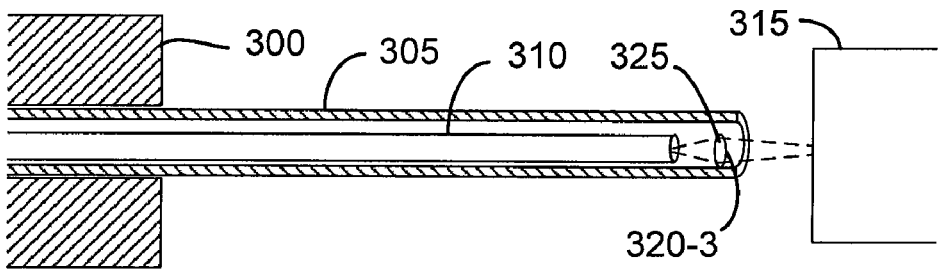

FIG. 3C shows another embodiment of an optical pyrometry assembly. In this disclosed embodiment a lens 325 is used to increase the collection efficiency of the light pipe 310 for light originating from a region of the edge of the substrate 315. The lens also may reduce the amount of stray light (from sources other than the substrate 315) which enters the light pipe 310. In this case the light receiver is the front interface of the lens 320-3 rather than the surface of the light pipe 310. The lens 325 may be supported by physical connections made to the sheath 305 but the lens 325 may, alternatively or in combination, be supported by physical connection to the light pipe 310. For processes which may affect the collection efficiencies of either the light pipe 310 or the lens 325, a purge gas may flow around the light pipe 310 and lens 325 in order to protect the surfaces from chemical reaction or deposition. The lens 325 may be smaller than the inner diameter of the sheath 305 as shown or may be made the larger even touching the inner diameter of the sheath 305 in embodiments. For a larger lens 325 apertures or notches may be made in the lens to allow a purge gas to flow.

Figure 3D:
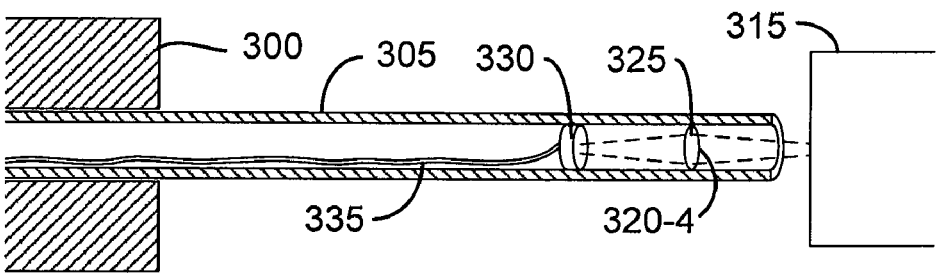
Figure 3E:
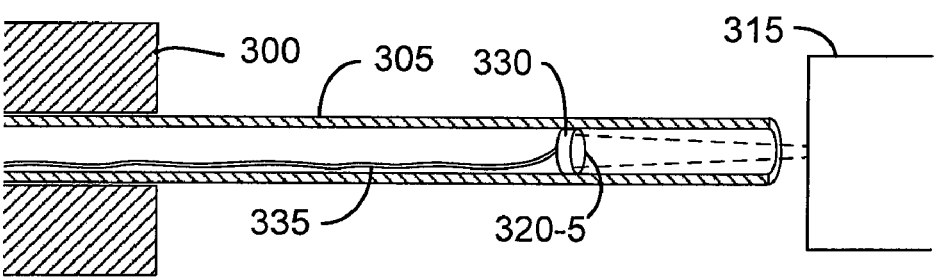

FIG. 3D shows another embodiment of an optical pyrometry assembly. In this disclosed embodiment electrical feedthrough pass electrical connections 335 into the processing chamber to an optical sensor 330. The electrical connections 335 may include power supplies and signal lines for outputting indications of the intensity of detected light. The optical sensor 330 may include one or more filters used to select one or more wavelengths or wavelength ranges for use in calculating a temperature of the substrate 315. A lens 325 is shown in the path between the substrate 315 and the optical sensor 330. The lens 325 may be used to increase the collection efficiency of the optical sensor 330. Once again, the light receiver is the front interface of the lens 320-4 and not the surface of the optical sensor 330. The optical sensor 330 and the lens 325 may be made with smaller outer diameters than the inner diameter of the sheath 305. In another disclosed embodiment, the optical sensor 330 and the lens 325 may have similar outer diameters to the inner diameter of the sheath 305. When the outer diameter of either optical element is similar to the inner diameter of the sheath, notches or apertures may be formed in the element to allow a purge gas to flow from left to right in the figure. FIG. 3E shows a related embodiment without a lens. Stray light may still be suppressed by the sheath 305 especially when the sheath 305 is made from optically absorbing material. The light receiver in this case is the front surface 320-5 of the optical sensor 330.

Silicon substrate pyrometry at higher wavelengths than around 1 µm is problematic due to the temperature dependence of the emissivity and the possibility that the emissivity is much smaller than unity. The temperature dependence of the emissivity affects measurements made of lightly doped silicon making pyrometry measurements of a common substrate in EPI chambers unreliable and/or irreproducible. An alternative to making the measurement from the substrate is to aim the pyrometry assembly at the side of the susceptor that supports the silicon substrate. Disclosed pyrometry assemblies may be used to measure susceptor temperatures as well as the temperatures of other substrate pedestals. The susceptor is often made from materials which have more favorable optical properties. Silicon carbide and silicon carbide coated graphite are often used to fabricate susceptors. The emissivity of silicon carbide remains closer to unity and is less affected by temperature than silicon. In fact, silicon carbide is reasonably close to a gray body for optical wavelengths in the range 0.8 µm to 6 µm. Aiming the pyrometer at a silicon carbide sample enables the use of higher wavelengths for pyrometry.

Figure 4:
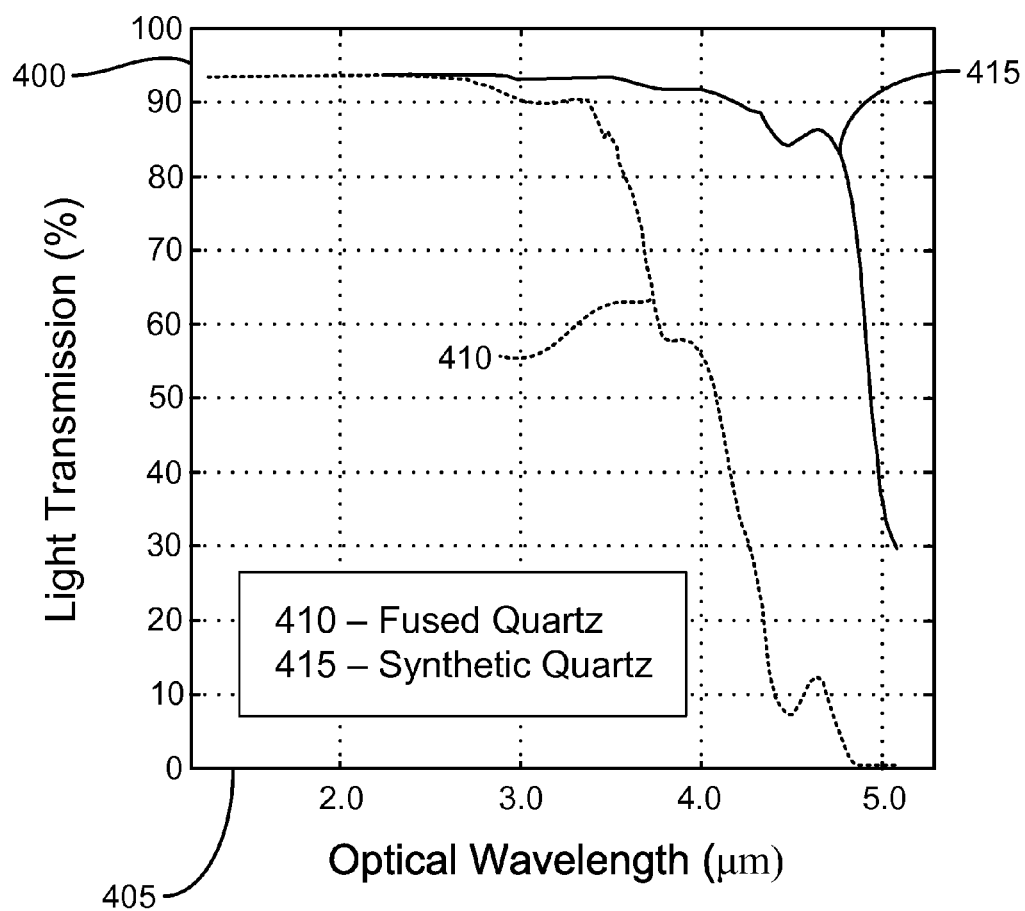
FIG. 4 is a graph of absorption for two different types of quartz.

A benefit of performing pyrometry at higher wavelengths was discussed with reference to FIG. 3. The benefit was a reduction in the ratio of optical intensity originating from heat lamps to the optical intensity originating from a thermally monitored sample at a significantly lower temperature. Further benefits are enabled by disclosed embodiments which locate the light receiver inside the processing chamber. The heat lamps are located on top and bottom separated from the chamber volume by quartz domes. The quartz domes are nearly opaque to light above about 4.5 um and therefore can be used as filters for pyrometry measurements made at these long wavelengths when the light receiver is located inside the processing chamber. FIG. 4 is a graph of transmissivity for different types of quartz. Fused quartz is more commonly used in EPI processing chambers and a transmissivity curve 410 for fused quartz is shown. The horizontal axis 405 is optical wavelength in microns (µm) and the vertical axis 400 is the percentage of transmitted light through 10 mm of material. Monitoring wavelengths greater than 3.0 µm or greater than 4.0 µm reduces the transmission of light from the heat lamps into the processing chamber by at least about 10% or about 50%, respectively. Performing optical pyrometry at, e.g. 4.5 µm, provides even greater benefit since stray lamp radiation near 4.5 µm may be suppressed by a factor of about 10 and may be nearly eliminated above 4.8 µm depending on the thickness chosen for the quartz dome. A transmissivity curve 415 is also shown for synthetic quartz which remains transparent out to a longer wavelength. Optical pyrometry may be performed at a wavelength higher than 5.0 µm to provide similar benefits using synthetic quartz.

The temperature of a substrate may be determined by detecting light coming from the susceptor or the substrate itself with minimal or no shielding of stray light provided near the light receiver. One circumstance in which pyrometry is performed directly from the substrate is when the substrate is supported by a mechanism other than a susceptor. For temperatures between about 650 C and 1300 C, pyrometry may be performed on a susceptor or substrate using emitted optical radiation with wavelength greater than 3 µm. For such measurements, the light receiver may be located inside or outside the substrate processing chamber. For even larger wavelengths (e.g. greater than 4 μm or 4.5 μm), the light receiver may be placed inside the substrate processing chamber and sufficient shielding may be provided by the optical absorption of a quartz dome or viewport. For all wavelengths, the numerical aperture of the light receiver may be reduced to provide shielding against light which is not thermally generated from the substrate or susceptor. The numerical aperture may be less than 0.1, 0.05 or 0.025 in different embodiments. A low numerical aperture may be used in combination with or in place of the absorptive shielding provided by the quartz and any shielding provided by a sheath.

For temperatures between about 300 C and 650 C, low wavelengths (less than about 1 μm or 1.2 μm, in embodiments) may be desirable when performing pyrometry from a silicon substrate in order to maintain a sufficient high emissivity. Under these conditions shielding provides greater value due to the large amount of light coming from heat lamps and the low absorption of the light by quartz. Shielding may be provided by a sheath which extends beyond the extent of the light receiver. Alone or in combination with a sheath, the numerical aperture of the light receiver may also be reduced to provide shielding. The numerical aperture may be less than 0.1, 0.05 or 0.025 in different embodiments. Wavelengths in the range from about 2 μm to 4 μm may be used for pyrometry inside or outside the substrate processing chamber with less light shielding than that used with optical radiation with wavelength near 1 μm.

Figure 5:
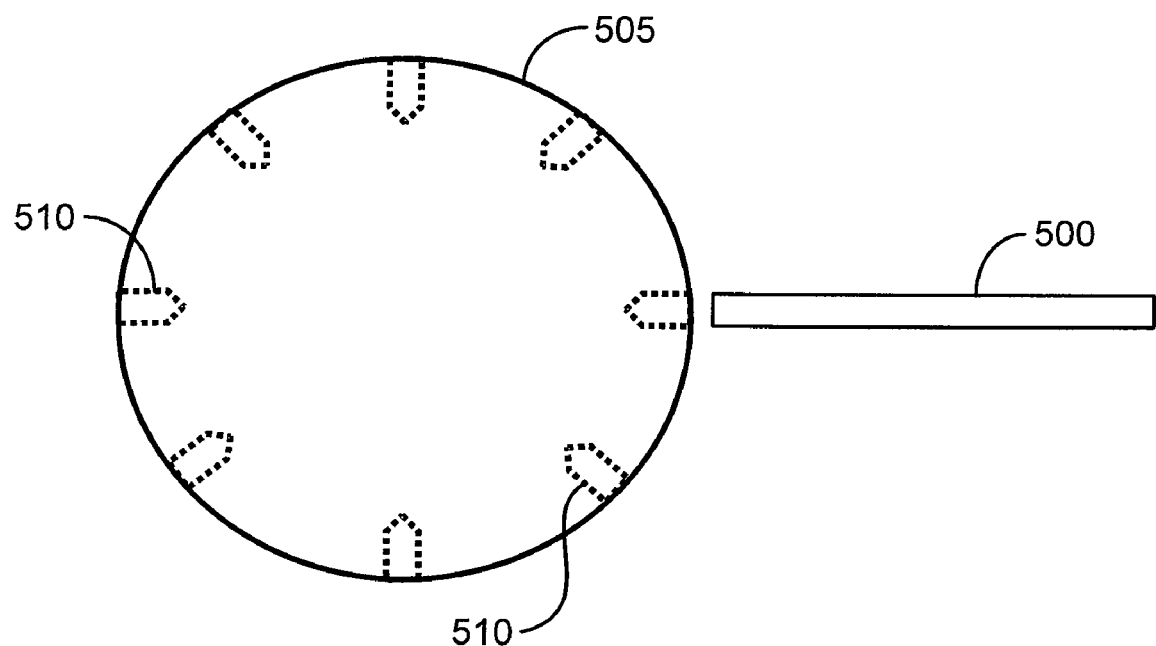
FIG. 5 is a schematic view of a pyrometer assembly and susceptor with geometric features according to disclosed embodiments.

Though the emissivity of silicon carbide is much more insensitive to temperature and wavelength than silicon substrates, a motivation persists to address the remaining dependence. One way to control emissivity regardless of the material used to create a susceptor is to manufacture high internal surface area geometric features in the region where the optical pyrometry is performed. FIG. 5 is a schematic view of a pyrometer assembly 500 and susceptor 505 with geometric features 510 along the edge. An optical pyrometer performing pyrometry measurements of geometric features formed from a material with less than unity emissivity detects more light than from a featureless object made from the same material. As the total internal area of a feature is increased relative to the area across the optical inlet, the perceived emissivity increases towards unity regardless of the material used to form the geometric feature.

Manufacturing shapes with larger internal radii than the radii of the aperture presents challenges and increases costs. One way to manufacture geometric features into a susceptor, which possess high total internal area but relatively small area across the optical inlet, is to drill a deep hole into the susceptor. Creating deep holes into a susceptor made from silicon carbide coated graphite, silicon carbide, silicon nitride, aluminum nitride and other highly emissive, optically absorbing ceramic materials results in a cylinder with internal surfaces characterized by the emissivity of graphite. The emissivity of graphite is very close to unity for the wavelengths between 0.8 μm and 6 μm, so the black body features have high emissivity even for relatively shallow holes. The optical signal from the edge of the susceptor exhibit regions of higher intensity as the optical pyrometry assembly collects light from regions of higher emissivity. The signal at or near the peak (or a statistical representation thereof) may be used as an indication of the temperature of the susceptor.

Alternatively, grooves may be machined around the circumference of the susceptor, in which case the signal from the pyrometer is more consistently indicative of the temperature of the susceptor. A groove would allow the higher speed or more accurate monitoring of the temperature of the susceptor because the useful data is not restricted to rotational positions aligning a hole with the pyrometers light receiver. Grooves are often easier to integrate into the susceptor manufacturing process flow, reducing costs further.

Figure 6:
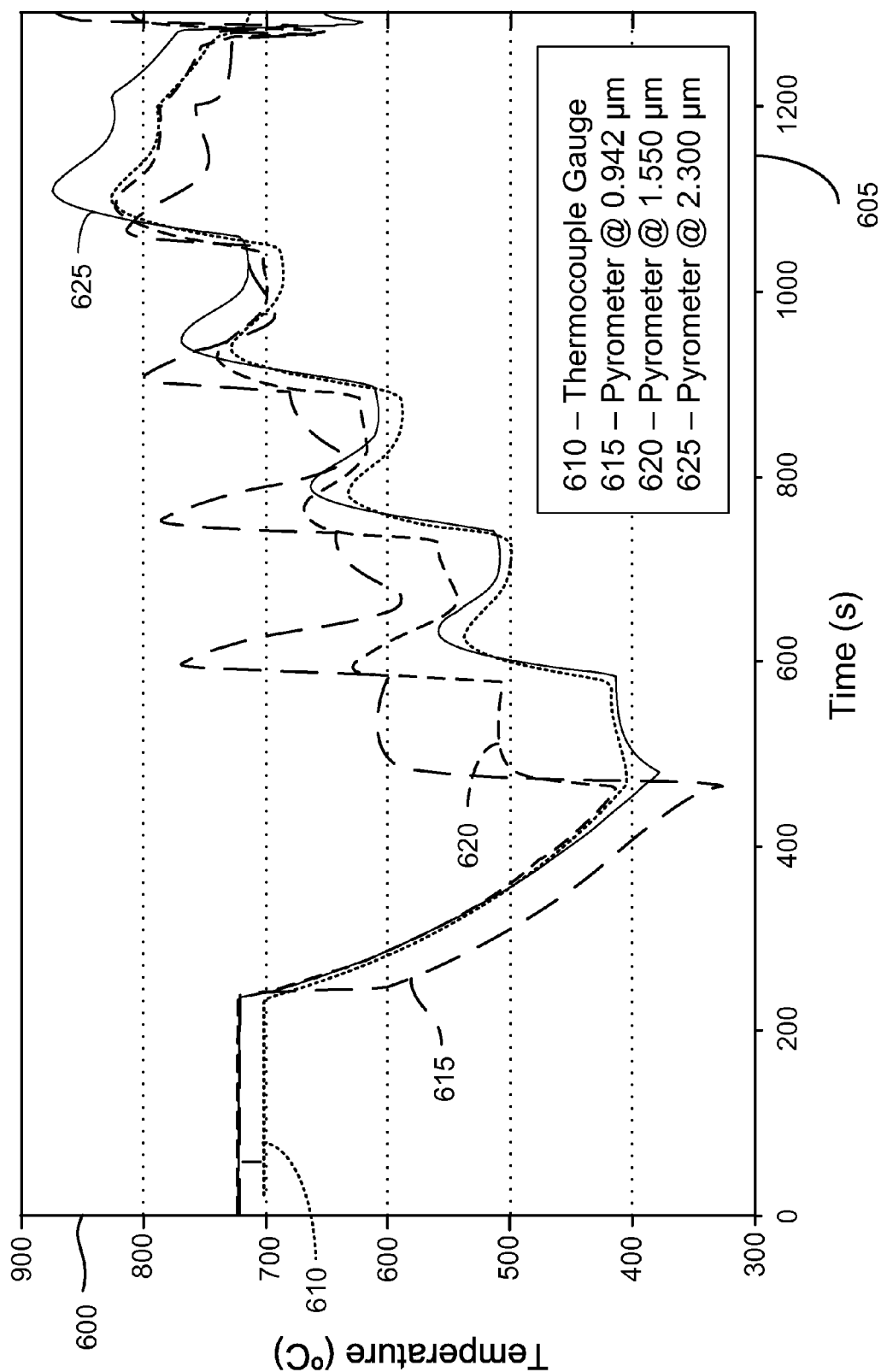
FIG. 6 is a graph of different temperature measurements, some of which were acquired with a pyrometry assembly according to disclosed embodiments.

In order to better understand and appreciate disclosed embodiments, reference is now made to FIG. 6 which is a graph of different temperature measurements of a susceptor acquired during a step-like temperature ramp. Three of the four data sequences were acquired with a light pipe with a lens (NA 0.05) in the light collection path. The light receiver (the susceptor side of the lens) was 0.1 inch from the edge of the susceptor. The sheath extended even closer to the susceptor; the separation was 0.075 inch. The sheath was made from silicon carbide with an inner diameter of 0.050 inch and an outer diameter of 0.118 inch. The light pipe had an outer diameter of 0.032 inch. One of the four data sequences was acquired with a thermocouple gauge mounted inside the preheat ring touching the edge of the susceptor.

The curve representing temperature measurements made with the thermocouple gauge is represented with a dotted line 610 and may not be an ideal indicator of the susceptor (or substrate) temperature. The thermocouple measurements can, however, be used to learn about the suitability of operating the pyrometry assembly at different wavelengths. The horizontal axis 605 is time in seconds and the vertical axis 600 is the temperature reading of the various methods in degrees Celsius. A curve representing temperature measurements made with the pyrometer operating at 0.942 μm is shown as a long-dashed line 615. Data was gathered at two other wavelengths in separate acquisitions. A curve representing temperature measurements made with the pyrometer operating at 1.550 μm is shown as a short-dashed line 620. Another curve representing temperature measurements made with the pyrometer operating at 2.300 μm is shown as a solid line 625. At 220 seconds, the heat lamps are turned off. The reading 615 from the 0.942 μm pyrometer reacts much more rapidly than the other readings and the rapidity is inconsistent with a cooling of an object with mass similar to that of the susceptor. The pyrometer operating at 0.942 μm appears to detect light from the lamps in this particular configuration. Consistently, discrete increases in heat lamp radiation at 460 seconds, 580 seconds, 730 seconds, 880 seconds and 1040 seconds cause the same rapid rise in the 0.942 μm pyrometer signal. This appears to corroborate the detection of heat lamp illumination on the pyrometer sensor.

The pyrometer measurements at 1.550 μm 620 do not exhibit nearly as sharp a fall (near 220 seconds) or rise (several locations including 1040 seconds and 880 seconds) compared to the pyrometer measurements at 0.942 μm. However, the pyrometer measurements at 1.550 μm 620 differ significantly from the thermocouple measurements 610 (note the region between 460 seconds and 780 seconds). This temporal region correlates with susceptor temperatures between 400° C. and 650° C. The significant deviation of the 1.550 μm pyrometer measurement 620 and the thermocouple measurement 610 indicates the ratio of the optical intensity from the heat lamps to the intensity from the susceptor is still too high between 400° C. and 650° C., making the protection offered by the sheath insufficient. The ratio becomes more conducive to pyrometry for higher wavelengths. The pyrometer measurements at 2.300 μm 625 tracks the thermocouple measurements 610 closely throughout the temperature range between 400° C. and 650° C. The thermocouple gauge may underreport the temperature of the susceptor due to the thermal load and location of the gauge (somewhat away from the susceptor). These distinctions may explain the remaining differences between the pyrometer measurements at 2.300 μm 625 and the thermocouple measurements 610.

Herein, the use of the terms "light", "optical" and "optics" does not carry any implication that the electromagnetic radiation involved must be from the visible portion of the spectrum. The light can be of any wavelength.

Exemplary Systems

Figure 7:
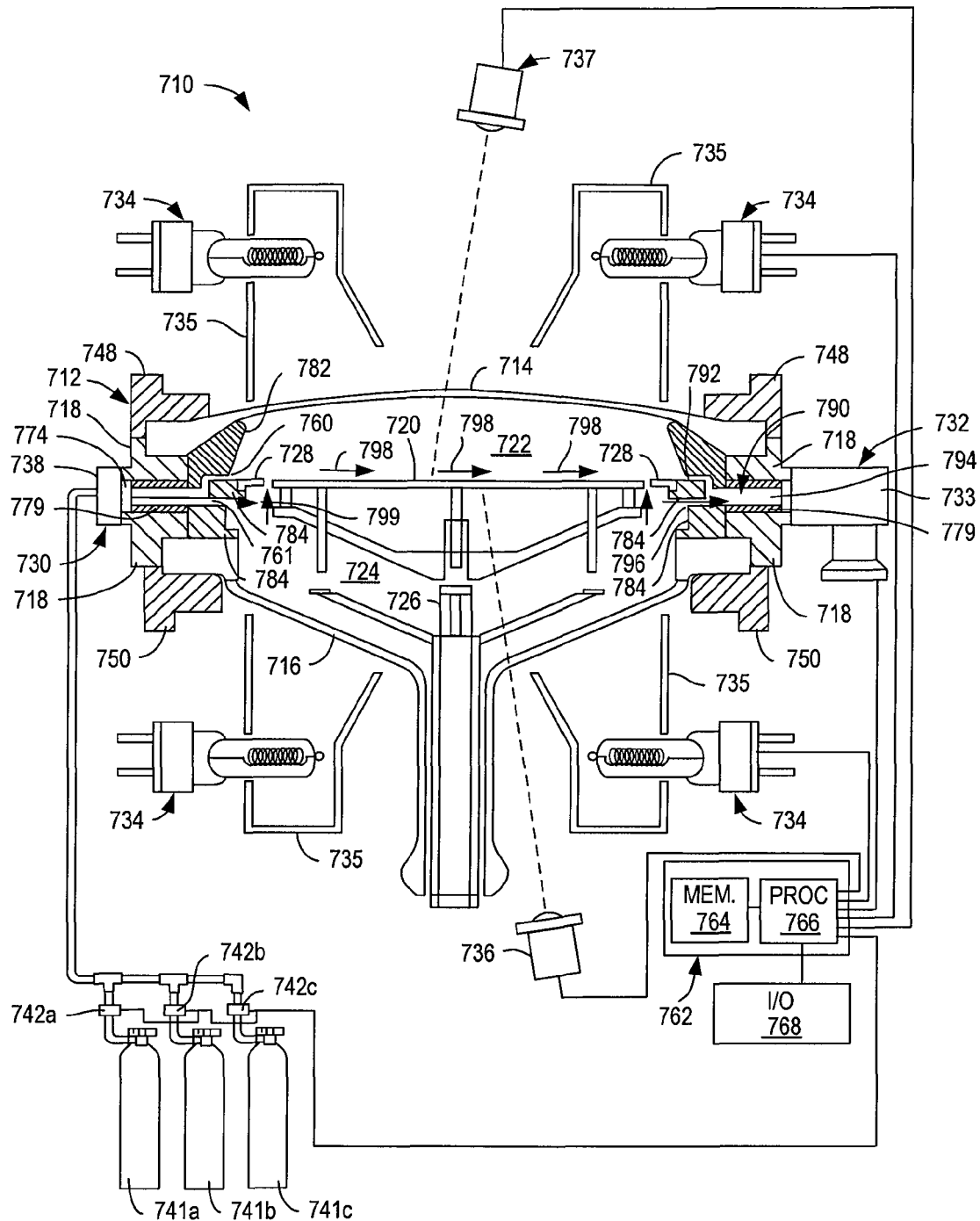
FIG. 7 is a cross-sectional view of a substrate processing system according to an embodiment of the invention.
Figure 8:
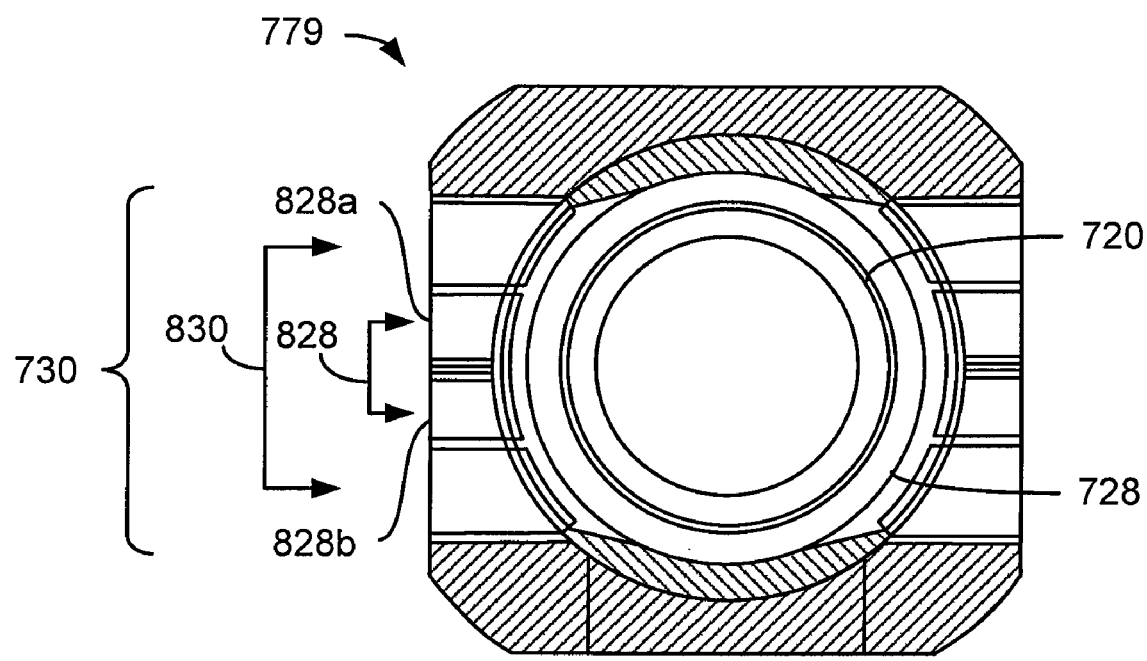
FIG. 8 is a top view of a portion of a substrate processing system according to an embodiment of the invention.

FIGS. 7-8 show an example of a substrate processing system according to embodiments of the invention. The processing apparatus 710 shown in FIG. 7 is a deposition reactor and includes a deposition chamber 712 having an upper dome 714, a lower dome 716 and a sidewall 718 between the upper and lower domes 714 and 716. Cooling fluid (not shown) may be circulated through sidewall 718 to cool o-rings used to seal domes 714 and 716 against sidewall 718. An upper liner 782 and a lower liner 784 are mounted against the inside surface of sidewall 718. The upper and lower domes 714 and 716 are made of a transparent material to allow heating light to pass through into the deposition chamber 712.

Within the chamber 712 is a flat, circular pedestal 720 for supporting a wafer in a horizontal position. The pedestal 720 can be a susceptor or other wafer supporting structure and extends transversely across the chamber 712 at the sidewall 718 to divide the chamber 712 into an upper portion 722 above the pedestal 720 and a lower portion 724 below the pedestal 720. The pedestal 720 is mounted on a shaft 726 which extends perpendicularly downward from the center of the bottom of the pedestal 720. The shaft 726 is connected to a motor (not shown) which rotates shaft 726 and thereby rotates the pedestal 720. An annular preheat ring 728 is connected at its outer periphery to the inside periphery of lower liner 784 and extends around the pedestal 720. The preheat ring 728 occupies nearly the same plane as the pedestal 720 with the inner edge of the preheat ring 728 separated by a gap from the outer edge of the pedestal 720.

An inlet manifold 730 is positioned in the side wall 718 of chamber 712 and is adapted to admit gas from a source of gas or gases, such as tanks 741*a-c*, into the chamber 712. The flow of gases from tanks 741*a-c* is preferably independently controlled with manual valves and computer controlled flow controllers 742*a-c*. An outlet port 732 is positioned in the side of chamber 712 diametrically opposite the inlet manifold 730 and is adapted to exhaust gases from the deposition chamber 712.

A plurality of high intensity lamps 734 is mounted around the chamber 712 and directs its light through the upper and lower domes 714, 716 onto the pedestal 720 (and preheat ring 728) to heat the pedestal 720 (and preheat ring 728). Pedestal 720 and preheat ring 728 are made of a material, such as silicon carbide, coated graphite which is opaque to the radiation emitted from lamps 734 so that they can be heated by radiation from lamps 734. The upper and lower domes 714, 716 are made of a material which is transparent to the light from the lamps 734, such as clear quartz. The upper and lower domes 714, 716 are generally made of quartz because quartz is transparent to light of both visible and IR frequencies. Quartz exhibits a relatively high structural strength and is chemically stable in the process environment of the deposition chamber 712. Although lamps are the preferred means for heating wafers in deposition chamber 712, other methods may be used such as resistance heaters and RF inductive heaters. An infrared temperature sensor 736 such as a pyrometer is mounted below the lower dome 716 and faces the bottom surface of the pedestal 720 through the lower dome 716. The temperature sensor 736 is used to monitor the temperature of the pedestal 720 by receiving infra-red radiation emitted from the pedestal 720. A temperature sensor 737 for measuring the temperature of a wafer may also be present in some disclosed embodiments.

An upper clamping ring 748 extends around the periphery of the outer surface of the upper dome 714. A lower clamping ring 750 extends around the periphery of the outer surface of the lower dome 716. The upper and lower clamping rings 748, 750 are secured together so as to clamp the upper and lower domes 714 and 716 to the side wall 718.

Reactor 710 includes a gas inlet manifold 730 for feeding process gases into chamber 712. Gas inlet manifold 730 includes a connector cap 738, a baffle 774, an insert plate 779 positioned within sidewall 718, and a passage 760 formed between upper liner 782 and lower liner 784. Passage 760 is connected to the upper portion 722 of chamber 712. Process gas from gas cap 738 passes through baffle 774, insert plate 779 and passage 760 and into the upper portion 722 of chamber 712.

Reactor 710 also includes an independent inert gas inlet 761 for feeding an inert purge gas, such as but not limited to, hydrogen ($H_2$) and nitrogen ($N_2$), into the lower portion 724 of deposition chamber 712. As shown in FIG. 7, inert purge gas inlet 761 can be integrated into gas inlet manifold 730, if preferred, as long as a physically separate and distinct passage 761 through baffle 774, insert plate 779, and lower liner 784 is provided for the inert gas, so that the inert purge gas can be controlled and directed independent of the process gas. Inert purge gas inlet 761 need not necessarily be integrated or positioned along with gas inlet manifold 730, and can for example be positioned on reactor 710 at an angle of 90° from deposition gas inlet manifold 730.

Reactor 710 also includes a gas outlet 732. The gas outlet 732 includes an exhaust passage 790 which extends from the upper chamber portion 722 to the outside diameter of sidewall 718. Exhaust passage 790 includes an upper passage 792 formed between upper liner 782 and lower liner 784 and which extends between the upper chamber portion 722 and the inner diameter of sidewall 718. Additionally, exhaust passage 790 includes an exhaust channel 794 formed within insert plate 779 positioned within sidewall 718. A vacuum source, such as a pump (not shown) for removing material from chamber 712 is coupled to exhaust channel 794 on the exterior of sidewall 718 by an outlet pipe 733. Thus, process gas fed into the upper chamber portion 722 is exhausted through the upper passage 792, through exhaust channel 794 and into outlet pipe 733.

The single wafer reactor shown in FIG. 7 is a "cold wall" reactor. That is, sidewall 718 and upper and lower liners 782 and 784, respectively, are at a substantially lower temperature than preheat ring 728 and pedestal 720 (and a wafer placed thereon) during processing. For example, in a process to deposit an epitaxial silicon film on a wafer, the pedestal and wafer are heated to a temperature of between 550-1200° C., while the sidewall (and liners) are at a temperature of about 400-600° C. The sidewall and liners are at a cooler temperature because they do not receive direct irradiation from lamps 734 due to reflectors 735, and because cooling fluid is circulated through sidewall 718.

Gas outlet 732 also includes a vent 796 which extends from the lower chamber portion 724 through lower liner 784 to exhaust passage 790. Vent 796 preferably intersects the upper passage 792 of exhaust passage 790 as shown in FIG. 7. Inert purge gas is exhausted from the lower chamber portion 724 through vent 796, through a portion of upper chamber passage 792, through exhaust channel 794, and into outlet pipe 733. Vent 796 allows for the direct exhausting of purge gas from the lower chamber portion to exhaust passage 790.

According to the present invention, process gas or gases 798 are fed into the upper chamber portion 722 from gas inlet manifold 730. A process gas, according to the present invention, is defined as a gas or gas mixture which acts to remove, treat, or deposit a film on a wafer or a substrate placed in chamber 712. According to the present invention, a process gas comprising HCl and an inert gas, such as $H_2$, is used to treat a silicon surface by removing and smoothing the silicon surface. In an embodiment of the present invention a process gas is used to deposit a silicon epitaxial layer on a silicon surface of a wafer placed on pedestal 720 after the silicon surface has been treated. Process gas 798 generally includes a silicon source, such as but not limited to, monosilane, trichlorosilane, dichlorosilane, and tetrachlorosilane, methyl-silane, and a dopant gas source, such as but not limited to phosphine, diborane, germane, and arsine, among others, as well as other process gases such as oxygen, methane, ammonia, etc. A carrier gas, such as $H_2$, is generally included in the deposition gas stream. For a process chamber with a volume of approximately 5 liters, a deposition process gas stream between 35-75 slm (including carrier gas) is typically fed into the upper chamber portion 722 to deposit a layer of silicon on a wafer. The flow of process gas 798 is essentially a laminar flow from inlet passage 760, across preheat ring 728, across pedestal 720 (and wafer), across the opposite side of preheat ring 728, and out exhaust passage 790. The process gas is heated to a deposition or process temperature by preheat ring 728, pedestal 720, and the wafer being processed. In a process to deposit an epitaxial silicon layer on a wafer, the pedestal 720 and preheat ring 728 are heated to a temperature of between 800° C.-1200° C. A silicon epitaxial film can be formed at temperatures as low as 550° C. with silane by using a reduced deposition pressure.

Additionally, while process gas is fed into the upper chamber portion, an inert purge gas or gases 799 are fed independently into the lower chamber portion 724. An inert purge gas is defined as a gas which is substantially unreactive at process temperatures with chamber features and wafers placed in deposition chamber 712. The inert purge gas is heated by preheat ring 728 and pedestal 720 to essentially the same temperature as the process gas while in chamber 712. Inert purge gas 799 is fed into the lower chamber portion 724 at a rate which develops a positive pressure within lower chamber portion 724 with respect to the process gas pressure in the upper chamber portion 722. Process gas 798 is therefore prevented from seeping down through gap and into the lower chamber portion 724, and depositing on the backside of pedestal 720.

FIG. 8 shows a portion of the gas inlet manifold 730 which supplies gas to the upper zone of the processing chamber. The insert plate 779 of FIG. 8 is shown to be constituted by an inner zone 828 and an outer zone 830. According to this embodiment of the invention the composition of the process gas which flows into inner zone 828 can be controlled independently of the composition of the gas which flows into outer zone 830. In addition, the flow rate of the gas to either of the two halves 828a, 828b of the inner zone 828 can be further controlled independently from one another. This provides two degrees of control for the gas flow for the purposes of controlling the composition of the process gas mix over different zones of the semiconductor wafer.

Processing apparatus 710 shown in FIG. 7 includes a system controller 762 which controls various operations of apparatus 710 such as controlling gas flows, substrate temperature, and chamber pressure. In an embodiment of the present invention the system controller 762 includes a hard disk drive (memory 764), a floppy disk drive and a processor 766. The processor contains a single board computer (SBC), analog and digital input/output boards, interface boards and stepper motor controller board. Various parts of processing apparatus 710 may conform to the Versa Modular Europeans (VME) standard which defines board, card cage, and connector dimensions and types. The VME standard also defines the bus structure having a 16-bit data bus and 24-bit address bus.

System controller 762 controls the activities of the apparatus 710. The system controller executes system control software, which is a computer program stored in a computer-readable medium such as a memory 764. Memory 764 may be a hard disk drive, but memory 764 may also be other kinds of memory. Memory 764 may also be a combination of one or more of these kinds of memory. The computer program includes sets of instructions that dictate the timing, mixture of gases, chamber pressure, chamber temperature, lamp power levels, pedestal position, and other parameters of a particular process. Of course, other computer programs such as one stored on another memory device including, for example, a floppy disk or another appropriate drive, may also be used to operate system controller 762. Input/output (I/O) devices 768 such as an LCD monitor and a keyboard are used to interface between a user, instrumentation and system controller 762.

The process for measuring and adjusting the substrate temperature in accordance with the present invention can be implemented using a computer program product which is stored in memory 764 and is executed by processor 766. The computer program code can be written in any computer readable programming language, such as, assembly language, C, C++, Pascal, Fortran, or others. Suitable program code is entered into a single file, or multiple files, using a program editor, and stored or embodied in a computer usable medium, such as a memory system of the computer. When the edited code is in a high level language, the code may be compiled, and the resultant compiled code is then linked with an object code of precompiled library routines. To execute the linked compiled object code, the system user invokes the object code, causing the computer system to load the code in memory, from which the CPU reads and executes the code to perform the tasks identified in the program. Also stored in memory 764 are process parameters such as process gas flow rates (e.g., $H_2$ and HCl flow rates), process temperatures and process pressure necessary to make measurements and adjustments in accordance with the present invention.

Figure 9A:
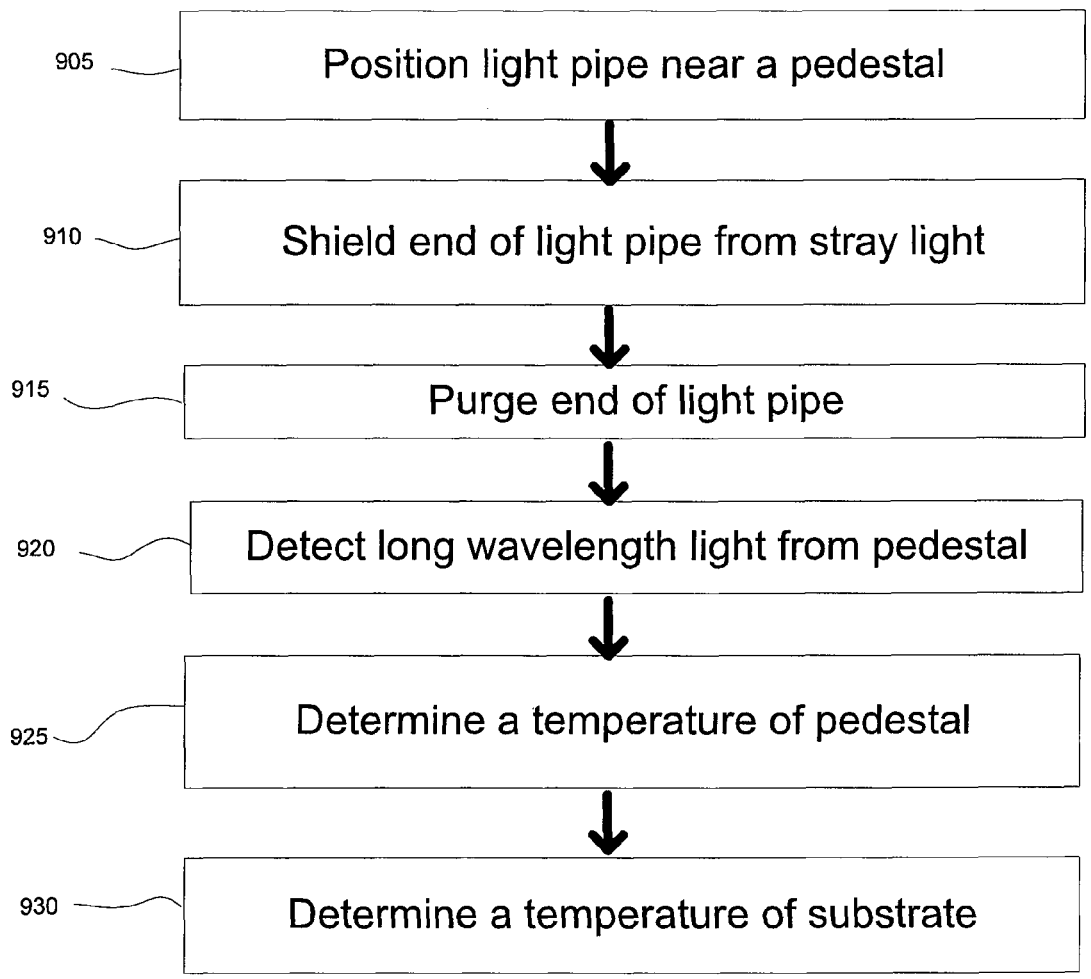
FIGS. 9A-B are flowcharts showing exemplary methods which may be used to determine the temperature of a substrate in a substrate processing system according to disclosed embodiments.
Figure 9B:
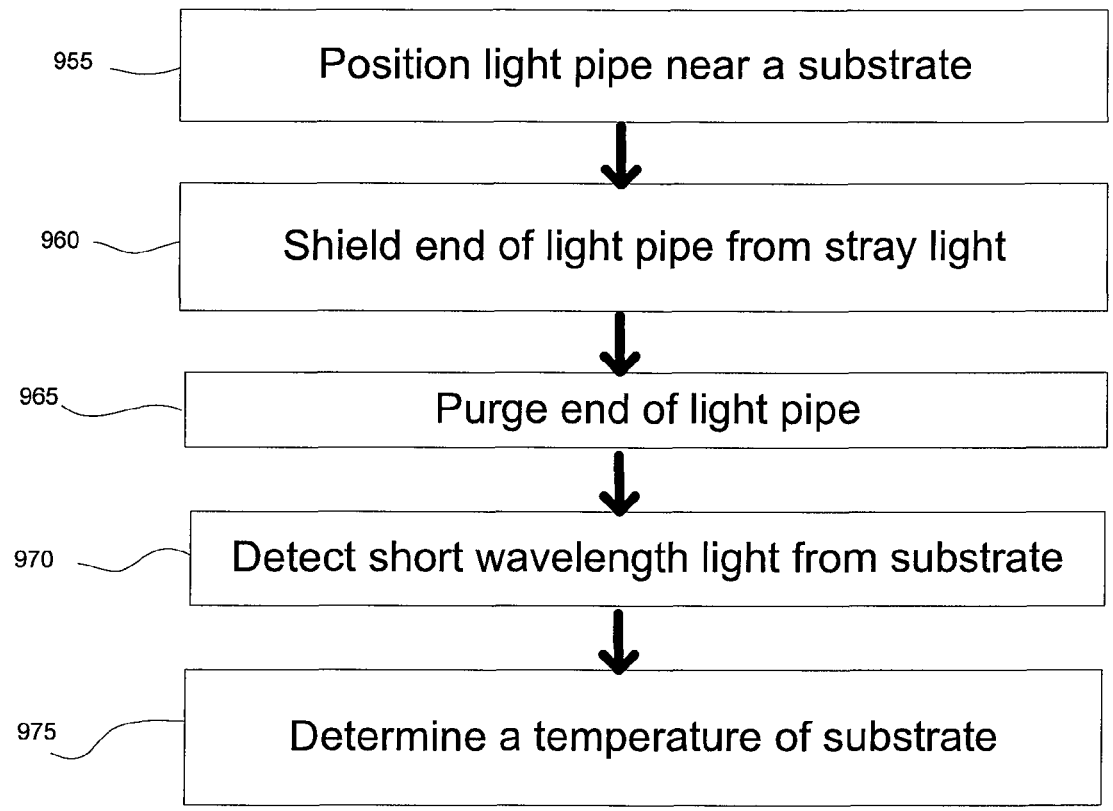

FIGS. 9A-B are flowcharts showing exemplary methods which may be used to determine the temperature of a substrate in a substrate processing system according to disclosed embodiments. In FIG. 9A, a light pipe is positioned near a pedestal which may be rotating (Step 905). The end of the light pipe is shielded from stray light (Step 910) in order to improve the accuracy and/or precision of a temperature determination of the pedestal and a substrate residing on the pedestal. In Step 915, an inert gas is flowed near the end of the light pipe to reduce contamination which may affect a temperature determination. Light of long wavelength (e.g. >4.5 µm) is detected coming from the pedestal (Step 920) and used to determine the pedestal temperature (Step 925). The pedestal temperature may then be used to determine the temperature of the substrate in Step 930.

In FIG. 9B, a light pipe is positioned near a substrate which may be rotating (Step 955). The end of the light pipe is shielded from stray light (Step 960) in order to improve the accuracy and/or precision of a temperature determination of the substrate. In Step 965, an inert gas is flowed near the end of the light pipe to reduce contamination which may affect a temperature determination. Light of short wavelength (e.g.

<1.2 µm) is detected coming from the substrate (Step 970) and used to determine the substrate temperature (Step 975).

In one embodiment, a substrate processing system includes a processing chamber, a pedestal for supporting a substrate disposed within the processing chamber, and an optical pyrometry assembly coupled to the processing chamber to measure an emitted light originating substantially from an edge of the pedestal. The optical pyrometry assembly further includes a light receiver and an optical detector. The light receiver may be within the processing chamber. The optical pyrometry assembly receives a portion of the emitted light, and a temperature of the pedestal is determined from an intensity of the portion of the emitted light near at least one wavelength.

In another embodiment, a portion of the processing chamber is transparent to allow a portion of light from heat lamps to enter the processing chamber.

In yet another embodiment, one or more of the at least one wavelength is greater than 3 µm in order to reduce an effect of stray light from outside the processing chamber on a temperature measurement.

In yet another embodiment, one or more of the at least one wavelength is greater than 4.5 µm in order to reduce an effect of stray light from outside the processing chamber on a temperature measurement.

In yet another embodiment, the portion of the emitted light that is received includes light at a first wavelength having a first intensity and light at a second wavelength having a second intensity. The temperature of the pedestal is determined from a ratio of the first intensity to the second intensity.

In yet another embodiment, a numerical aperture of the light receiver is less than about 0.1, 0.5 or 0.025.

In yet another embodiment, the optical pyrometry assembly further includes a sheath wherein the sheath extends at least 0.005 inch beyond the light receiver to reduce an amount of stray light entering the light receiver.

In yet another embodiment, the light receiver is within 0.200 inch of the edge of the pedestal.

In yet another embodiment, a substrate processing system includes a processing chamber and an optical pyrometry assembly coupled to the processing chamber to measure an emitted light originating substantially from a portion of the substrate. The optical pyrometry assembly includes a light receiver and an optical detector. The light receiver is within the processing chamber. The optical pyrometry assembly receives a portion of the emitted light, and a temperature of the substrate is determined from an intensity of the portion of the emitted light near at least one wavelength.

In yet another embodiment, the temperature of the substrate is less than about 650 degrees Celsius.

In yet another embodiment, one or more of the at least one wavelength is less than about 1.2 µm.

In yet another embodiment, one or more of the at least one wavelength is less than about 1.0 µm.

In yet another embodiment, a numerical aperture of the light receiver is less than about 0.1, 0.5 or 0.025.

In yet another embodiment, a portion of the processing chamber is transparent to allow a portion of light from heat lamps to enter the processing chamber.

In yet another embodiment, one or more of the at least one wavelength is greater than 3 µm in order to reduce an effect of stray light from outside the processing chamber on a temperature measurement.

In yet another embodiment, one or more of the at least one wavelength is greater than 4.5 µm in order to reduce an effect of stray light from outside the processing chamber on a temperature measurement.

In yet another embodiment, the portion of the emitted light that is received includes light at a first wavelength having a first intensity and light at a second wavelength having a second intensity. The temperature of the substrate is determined from a ratio of the first intensity to the second intensity.

In yet another embodiment, the light receiver is within 0.200 inch of the edge of the pedestal or the substrate.

In yet another embodiment, the substrate processing system further includes a sheath that extends at least 0.005 inch beyond the light receiver to reduce an amount of stray light entering the light receiver.

In yet another embodiment, wherein the portion of the substrate is includes the edge of the substrate.

In yet another embodiment, a substrate processing system includes a processing chamber, a pedestal for supporting a substrate disposed within the processing chamber, wherein the pedestal has one or more features on an portion of the pedestal to increase an optical emissivity in the vicinity of the one or more features near at least one wavelength, and an optical pyrometry assembly coupled to the processing chamber to measure an emitted light originating substantially from the portion of the pedestal. The optical pyrometry assembly further includes a light receiver coupled to a first end of a light pipe. The optical pyrometry assembly also includes an optical detector coupled to the light receiver for detecting a portion the emitted light. The temperature of the pedestal is determined from an intensity of the portion of the emitted light near at least one wavelength.

In yet another embodiment, the light receiver is substantially aligned with the portion of the pedestal and receives light emanating from the one or more features.

In yet another embodiment, the optical pyrometry assembly further includes a sheath disposed near the end of the light receiver to reduce stray light entering the light pipe.

In yet another embodiment, the sheath extends past the end of the light pipe but does not prevent light from traveling between the portion of the pedestal and the light receiver.

In yet another embodiment, the sheath extends past the end of the light pipe but does not cover the opening at the end of the light pipe.

In yet another embodiment, the portion of the pedestal comprises the edge of the pedestal.

In yet another embodiment, the optical pyrometry assembly further includes a gas inlet disposed near a second end of the light pipe. The gas inlet is coupled to a channel within the light pipe wherein a gas that is supplied to the gas inlet flows through the channel to the first end of the light pipe and into the chamber purging the first end of the light pipe with the gas.

In yet another embodiment, the gas comprises at least one of hydrogen, nitrogen and argon.

In yet another embodiment, a flow rate of the gas is between about 200 standard cubic centimeters per minute (sccm) and 8 standard liters per minute (slm).

In yet another embodiment, the one or more features on the edge of the pedestal includes a groove around the edge of the pedestal.

In yet another embodiment, the one or more features on the edge of the pedestal includes holes drilled into the pedestal wherein at least one of the holes has a total internal area at least two times the area across an opening of the hole.

In yet another embodiment, a method of measuring a temperature of a substrate during processing, includes disposing a light pipe near a portion of a pedestal or the substrate, shielding the end of the light pipe from stray light so that the end of the light pipe receives light from a portion of the pedestal or substrate, purging the end of the light pipe with a gas to reduce contamination of the end of the light pipe, detecting a portion of the light emitted from the pedestal or substrate and received by the light pipe, and determining a temperature of the substrate from the intensity of the portion of the emitted light from the pedestal or substrate near at least one wavelength.

In yet another embodiment, the method further includes rotating the pedestal and/or substrate while the temperature is being measured.

In yet another embodiment, the method further includes purging the end of the light pipe with a gas that includes at least one of hydrogen, nitrogen and argon.

In yet another embodiment, the method further includes flowing between about 200 standard cubic centimeters per minute (sccm) and 8 standard liters per minute (slm) of a gas to purge the end of the light pipe.

In yet another embodiment, the pedestal has one or more features on an edge of the pedestal to increase an apparent optical emissivity in the vicinity of the one or more features near at least one wavelength and the step of detecting a portion of the light emitted from the pedestal further includes detecting emitted light from the features.

In yet another embodiment, one or more of the at least one wavelength is greater than 3 µm in order to reduce an effect of stray light on a temperature measurement.

In yet another embodiment, one or more of the at least one wavelength is greater than 4.5 µm in order to reduce an effect of stray light on a temperature measurement.

It will also be recognized by those skilled in the art that, while the invention has been described above in terms of preferred embodiments, it is not limited thereto. Various features and aspects of the above-described invention may be used individually or jointly. Further, although the invention has been described in the context of its implementation in a particular environment and for particular applications, those skilled in the art will recognize that its usefulness is not limited thereto and that the present invention can be utilized in any number of environments and implementations.

What is claimed is:

1. A substrate processing system comprising:
   a processing chamber;
   a pedestal to support a substrate disposed within the processing chamber;
   an optical pyrometry assembly to measure an emitted light originating substantially from an edge of the pedestal, the optical pyrometry assembly comprising:
      a light receiver; and
      an optical detector;
   wherein the optical pyrometry assembly receives a portion of the emitted light; and
   wherein a temperature of the pedestal is determined from an intensity of the portion of the emitted light near at least one wavelength.

2. The substrate processing system of claim 1 wherein the light receiver is disposed within the processing chamber.

3. The substrate processing system of claim 1 wherein a portion of the processing chamber is transparent to allow a portion of light from heat lamps to enter the processing chamber.

4. The substrate processing system of claim 3 wherein one or more of the at least one wavelength is greater than 3 µm.

5. The substrate processing system of claim 3 wherein one or more of the at least one wavelength is greater than 4.5 µm.

6. The substrate processing system of claim 1 wherein a numerical aperture of the light receiver is less than about 0.1.

7. The substrate processing system of claim 1 wherein a numerical aperture of the light receiver is less than about 0.05.

8. The substrate processing system of claim 1 wherein a numerical aperture of the light receiver is less than about 0.025.

9. The substrate processing system of claim 1 wherein the portion of the emitted light that is received comprises light at a first wavelength having a first intensity and light at a second wavelength having a second intensity and wherein the temperature of the pedestal is determined from a ratio of the first intensity to the second intensity.

10. The substrate processing system of claim 1 further comprising a sheath wherein the sheath extends at least 0.005 inch beyond the light receiver.

11. The substrate processing system of claim 1 wherein the light receiver is within 0.200 inch of the edge of the pedestal.

12. The substrate processing system of claim 1 wherein the pedestal has one or more features on the edge of the pedestal to increase an apparent optical emissivity in the vicinity of the one or more features near at least one wavelength.

13. A substrate processing system comprising:
   a processing chamber;
   an optical pyrometry assembly to measure an emitted light originating substantially from a portion of a substrate, the optical pyrometry assembly comprising
      a light receiver; and
      an optical detector;
   wherein the optical pyrometry assembly receives a portion of the emitted light;
   wherein the light receiver is disposed within the processing chamber; and
   wherein a temperature of the substrate is determined from an intensity of the portion of the emitted light near at least one wavelength.

14. The substrate processing system of claim 13 wherein the temperature of the substrate is less than about 650 degrees Celsius.

15. The substrate processing system of claim 13 wherein one or more of the at least one wavelength is less than about 1.2 µm.

16. The substrate processing system of claim 13 wherein one or more of the at least one wavelength is less than about 1.0 µm.

17. The substrate processing system of claim 13 wherein a numerical aperture of the light receiver is less than about 0.1.

18. The substrate processing system of claim 13 wherein a numerical aperture of the light receiver is less than about 0.05.

19. The substrate processing system of claim 13 wherein a numerical aperture of the light receiver is less than about 0.025.

20. The substrate processing system of claim 13 wherein a portion of the processing chamber is transparent to allow a portion of light from heat lamps to enter the processing chamber.

21. The substrate processing system of claim 20 wherein one or more of the at least one wavelength is greater than 3 µm.

22. The substrate processing system of claim 20 wherein one or more of the at least one wavelength is greater than 4.5 µm.

23. The substrate processing system of claim 13 further comprising a sheath wherein the sheath extends at least 0.005 inch beyond the light receiver.

24. The substrate processing system of claim 13 wherein the portion of the substrate comprises the edge of the substrate.

25. The substrate processing system of claim 24 wherein the light receiver is within 0.200 inch of the edge of the substrate.

* * * * *